(12) United States Patent
Nishihata

(10) Patent No.: US 10,418,176 B2
(45) Date of Patent: *Sep. 17, 2019

(54) APPARATUS FOR ALIGNING MAGNETIC WIRE AND METHOD FOR ALIGNING THE SAME

(71) Applicant: AICHI STEEL CORPORATION, Tokai-shi (JP)

(72) Inventor: Katsuhiko Nishihata, Aichi (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,852

(22) Filed: Nov. 7, 2017

(65) Prior Publication Data

US 2019/0051457 A1    Feb. 14, 2019

Related U.S. Application Data

(63) Continuation of application No. 15/674,171, filed on Aug. 10, 2017.

(51) Int. Cl.
*H01F 41/096* (2016.01)
*B65H 59/06* (2006.01)
(Continued)

(52) U.S. Cl.
CPC ........... *H01F 41/096* (2016.01); *B65H 59/06* (2013.01); *H01F 3/06* (2013.01); *H01F 41/0206* (2013.01);
(Continued)

(58) Field of Classification Search
CPC ............... H01F 41/096; G01R 33/09
(Continued)

(56) References Cited

U.S. PATENT DOCUMENTS 4,527,614 A    7/1985    Masumoto et al.
4,781,771 A    11/1988    Masumoto et al.
(Continued)

FOREIGN PATENT DOCUMENTS

JP    2000-81471    3/2000
JP    5839530    1/2016

OTHER PUBLICATIONS

Exhibit 1003, Declaration of Katsuhiko Nishihata, for U.S. Appl. No. 15/674,171, filed Nov. 9, 2017, Case No. DER2018-00005; 41 pages.
(Continued)

*Primary Examiner* — Jay Patidar
(74) *Attorney, Agent, or Firm* — Morrison & Foerster LLP

(57) ABSTRACT

Apparatus for aligning magnetic wire aligns magnetic wires on a wire alignment substrate along its base lines, which are positions the magnetic wires are aligned with, with a small interval and without inducing torsional stresses. A microscope is used to detect misplacement between the base line and a reference line that is the magnetic wire taking a form of a straight line under application of tensile force and pulled out by a wire chuck. The misplacement is corrected using a position adjustment device of a substrate attaching base to which the wire alignment substrate is attached. The magnetic wires are temporarily fixed to the wire alignment substrate by magnetic power, and then permanently fixed to the wire alignment substrate using resin while free from the torsional stresses.

4 Claims, 10 Drawing Sheets

(51) Int. Cl.
    *H01F 3/06* (2006.01)
    *H01F 41/02* (2006.01)
    *G01R 33/06* (2006.01)
    *H01F 1/153* (2006.01)
    *H01F 41/04* (2006.01)

(52) U.S. Cl.
    CPC ........ *B65H 2701/36* (2013.01); *G01R 33/063* (2013.01); *H01F 1/15391* (2013.01); *H01F 41/046* (2013.01)

(58) Field of Classification Search
    USPC .................................. 324/249–252; 29/592.1
    See application file for complete search history.

(56) References Cited

U.S. PATENT DOCUMENTS 8,587,300 B2    11/2013    Honkura et al.
2016/0329150 A1    11/2016    Honkura

OTHER PUBLICATIONS

Exhitit 1004, Declaration of Michiharu Yamamoto, for U.S. Appl. No. 15/674,171, filed Nov. 7, 2017 Case No. DER2018-00005; 18 pages.
Exhibit 1005, Declaration of Hiroaki Asano, for U.S. Appl. No. 15/674,171, filed Nov. 9, 2017, Case No. DER2018-00005; 13 pages.
Exhibit 1006, Nishihata Lab Book Entries (Japanese Original), Jun. 2000; 5 pages.
Exhibit 1007, Nishihata Lab Book Entries (English Translation), Nov. 9, 2017; 6 pages.
Exhibit 1008, Nishihata Dec. 2000 Presentation (Japanese Original); 20 pages.
Exhitit 1009, Nishihata Dec. 2000 Presentation (English Translation), Nov. 9, 2017; 21 pages.
Exhibit 1010, Aichi Steel Jan. 2001 Report (Japanese Original); 1 page.
Exhibit 1011, Aichi Steel Jan. 2001 Report (English Translation), Nov. 9, 2017; 2 pages.
Exhibit 1012, Aichi Steel Jul. 2001 Report (Japanese Original); 28 pages.
Exhibit 1013, Aichi Steel Jul. 2001 Report (English Translation), Nov. 8, 2017; 29 pages.
Exhibit 1014, MagneDesign Email Communication Thursday, Sep. 5, 2013, 10:12 AM (Japanese Original); 2 pages.
Exhibit 1015, MagneDesign Email Communication Thursday, Sep. 5, 2013, 10:12 AM (English Translation), Nov. 9, 2017; 3 pages.
Exhibit 1016, MagneDesign Email Communication Thursday, Sep. 5, 2013, 4:50 PM (Japanese Original); 1 page.
Exhibit 1017, MagneDesign Email Communication Thursday, Sep. 5, 2013, 4:50 PM (English Translation), Nov. 9, 2017; 2 pages.
Exhibit 1018, MagneDesign Email Communication Thursday, Sep. 5, 2013, 4:50 PM Attachment; 1 page.
Exhibit 1019, MagneDesign Email Communication Thursday, Sep. 5, 2013, 9:15 PM (Japanese Original); 2 pages.
Exhibit 1020, MagneDesign Email Communication Thursday, Sep. 5, 2013, 9:15 PM (English Translation), Nov. 9, 2017; 4 pages.
Exhibit 1021, MagneDesign Email Communication Friday, Sep. 6, 2013, 9:00 AM (Japanese Original); 1 page.
Exhibit 1022, MagneDesign Email Communication Friday, Sep. 6, 2013, 9:00 AM (English Translation), Nov. 9, 2017; 4 pages.
Exhibit 1023, MagneDesign Email Communication Friday, Sep. 6, 2013, 9:00 AM Attachment (Japanese Original); 1 page.
Exhibit 1024, MagneDesign Email Communication Friday, Sep. 6, 2013, 9:00 AM Attachment (English Translation), Nov. 9, 2017; 1 page.
Exhibit 1025, Aichi Steel's Base Model (Japanese Original), Dec. 1, 2003; 1 page.
Exhibit 1026, Aichi Steel's Base Model (English Translation); Dec. 1, 2003; 1 page.
Exhibit 1027, Aichi Steel's USB Log (Japanese Original); 29 pages.
Exhibit 1028, Aichi Steel's USB Log (English Translation), Nov. 9, 2017; 27 pages.
Petition to Institute Derivation Proceeding of U.S. Appl. No. 15/148,641, by Aichi Steel Corporation, U.S. Appl. No. 15/674,171, Case No. DER2018-00005, Nov. 10, 2017; 84 pages.
Petition to Institute Derivation Proceeding of U.S. Appl. No. 15/148,641, by Aichi Steel Corporation, U.S. Appl. No. 15/805,852, Case No. DER2018-00006, Nov. 10, 2017; 79 pages.
Exhibit 1003, Declaration of Katsuhiko Nishihata, for U.S. Appl. No. 15/805,852, filed Nov. 9, 2017, Case No. DER2018-00006; 41 pages.
Exhibit 1004, Declaration of Michiharu Yamamoto, for U.S. Appl. No. 15/805,852, filed Nov. 7, 2017, Case No. DER2018-00006; 18 pages.
Exhibit 1005, Declaration of Hiroaki Asano, for U.S. Appl. No. 15/805,852, filed Nov. 9, 2017, Case No. DER2018-00006; 13 pages.
Decision Granting In-Part Motion Seeking Entry of Adverse Judgment and Correction of Inventorship dated Apr. 10, 2019, issued in Derivation Proceeding Case No. DER2018-00005; 9 pages.
Decision Granting In-Part Motion Seeking Entry of Adverse Judgment and Correction of Inventorship dated Apr. 10, 2019, issued in Derivation Proceeding Case No. DER2018-00006; 9 pages.
Nishihata, Katsuhiko et al., U.S. Office Action dated Mar. 15, 2018, directed to U.S. Appl. No. 15/674,171; 18 pages.

APPARATUS FOR ALIGNING MAGNETIC WIRE AND METHOD FOR ALIGNING THE SAME

CROSS-REFERENCE TO RELATED APPLICATION

This application is a continuation of U.S. application Ser. No. 15/674,171, filed Aug. 10, 2017, the entire contents of which is incorporated herein by reference.

BACKGROUND OF THE INVENTION

Field of the Invention

The invention relates to apparatus for aligning multiple magnetic wires with predetermined positions on a substrate, such as grooves formed on the substrate, without inducing stresses, such as torsional stresses, in the magnetic wires. The invention also relates to a method for aligning multiple magnetic wires, which is practiced by the apparatus.

Super high sensitivity micro magnetic sensors, such as MI sensors and orthogonal fluxgate sensors, which use as a magnetism detecting body superfine amorphous magnetic wires having a diameter of, for example, about 10 to 30 µm, which is smaller than a hair having a diameter of about 150 µm, are finding applications in various fields, such as electronic compasses, medical sensors and security sensors. For example, a detection-coil output type MI element, which is one type of magnetic field detection elements, has on a substrate an amorphous magnetic wire aligned in the longitudinal direction of the element, a detection coil that surrounds the wire, and electrodes connected to both ends of the coil and the wire.

Before being integrated into the magnetic sensors, the magnetic wires used as the magnetism detecting body in the magnetic sensors are heat treated while being subject to a load of tensile force so that the internal stresses in the wires are adjusted to have a predetermined value so as to have improved magnetic properties as a magnetic sensor. Accordingly, when the magnetic wire having a predetermined internal stresses is integrated into a magnetic sensor, such as an MI sensor, additional stresses must not be induced into the magnetic wire so as to avid degrading of the magnetic properties because of the change in the internal stresses in the magnetic wire that may occur in manufacturing processes, such as connecting of the wire and its electrode. However, there was no apparatus or method to achieve mass production of magnetic sensors having a magnetic wire of predetermined induced stresses with good productivity prior to this invention.

Specifically, when a magnetic wire is integrated into an MI sensor, a magnetic wire of a diameter of, for example, about 10 to 30 µm is placed on a substrate and both ends of the wire need to be connected to corresponding electrodes. The connection between the ends of the wire and the electrodes may be made, for example, by soldering. However, when a very fine wire is simply soldered to an electrode, it is almost impossible to avoid inducing additional stresses into the wire having a predetermined induced stress during soldering connection. In many cases, connecting the wire to the electrode by soldering results in inducement of additional and uncontrollable internal stresses in the wire. This leads to degrading of the magnetic properties of the magnetic wire and, thus, lowering of the performance of the magnetic sensor. The soldering is not the only cause of degrading of the magnetic properties of the magnetic wire. The magnetic wires are superfine, and even placing the magnetic wire on the substrate of the magnetic sensor often induces additional stresses into the wire, which practically prevents mass production of magnetic sensors, such as an MI sensor, with good productivity.

Japanese Patent Publication No. 2000-81471 discloses a method of manufacturing a magnetic sensor, which employs ultrasonic waves to bond both ends of a magnetic wire while the magnetic wire lies freely on a substrate. The ultrasonic bonding must be performed for each of magnetic sensing element. The publication explains that the magnetic wire bonded to the substrate in this manner is free from torsional stresses and the method produces a sensor output that is symmetrical.

Currently, as its applications expand, MI sensors are expected to improve the sensitivities, to become smaller and to have a wider measuring rage, among other expectations. For example, the following improvements are being considered in the field of high sensitivity, micro MI element: changing the diameter of the magnetic wire from 30 µm to 10 µm; introducing multiple magnetic wires as magnetism detecting bodies in one MI element; and making smaller the interval of the coils that surround the magnetic wires.

SUMMARY OF THE INVENTION

As described above, there is more than one problem to solve before achieving mass production of an MI sensor that takes full advantage of the magnetic properties of an amorphous magnetic wire. First of all, there must be apparatus or a method that enables, in a mass production scale with good productivity, alignment of a superfine magnetic wire, which is smaller than a hair, on predetermined positions on a substrate of a magnetic sensor without inducing additional stresses into the magnetic wire, other than the predetermined stresses that have been induced into the wire prior to the integration into the magnetic sensor, so as to avoid degrading of the magnetic properties of the magnetic wire.

The method described in the Japanese patent publication described above is not suitable for mass production, because ultrasonic bonding must be performed for each connection at a time. Further, the publication discloses no techniques for aligning magnetic wires on a substrate in a mass production scale. Although MI elements are expected to have higher sensitivity and to become smaller as explained above, such improvements cannot be achieved without achieving efficient alignment of magnetic wires on a substrate in the first place. Regardless the specification of an MI element, mass production of such an element is not possible without efficient alignment of magnetic wires.

At the time the inventor of this application set out to solve this problem, there was no apparatus that enables, in a mass production scale, alignment of multiple superfine magnetic wires of about a few tens of microns, which is smaller than a hair, on predetermined positions on a substrate of a magnetic sensor continuously and with good productivity. This is not surprising because there was no market demand for a product that requires such fine alignment of superfine magnetic wire on a substrate.

The invention has been made to address such a problem. A purpose of the invention is to provide apparatus for aligning magnetic wire, which has been heat treated under application of tensile force prior to integration into a magnetic sensor so as to have optimum magnetic properties for the magnetic sensor, on a substrate without inducing additional stresses into the magnetic wire and thus without degrading of the magnetic properties in order to take full advantage of the optimum magnetic properties in a mass production scale with good productivity.

The invention provides apparatus for aligning magnetic wire on a substrate. The apparatus includes a wire supply device, a wire alignment device, a misplacement detection device and a control device. The wire supply device includes a wire bobbin, a wire reel, a wire tensile force loading device and a wire holding part that holds a magnetic wire so as to avoid misplacement of the magnetic wire from a predetermined position. The wire alignment device includes a wire chuck for pulling out the wire from the wire supply device, an intermediate wire holding part that holds the magnetic wire at an intermediate position so as to avoid misplacement of the magnetic wire, which is pulled out to be under a proper tension, from a predetermined position, a wire alignment substrate on which magnetic wires are aligned, a substrate attaching base to which the wire alignment substrate is attached, and a cutter that cuts the magnetic wire. The detection device detects misplacement between a reference line that is determined by the longitudinal direction of the magnetic wire pulled out to be under the proper tension and a base line that indicates a predetermined position for aligning the magnetic wire on the wire alignment substrate. The control device controls respective parts of the apparatus to continuously perform the pulling out of the magnetic wire by the wire chuck, the alignment of the magnetic wire on the wire alignment substrate, and the cutting of the aligned magnetic wire. The substrate attaching base includes a position adjustment device that can move horizontally and vertically and can rotate so as to adjust the position of the substrate attaching base in order to match the reference line of the magnetic wire pulled out to be under the proper tension with the base line on the wire alignment substrate, and a magnetic power generation device that generate magnetic power to have the magnetic wire adhere to the base line on the wire alignment substrate.

The invention has been made in view of the following insights. First, in order to align the superfine magnetic wire with a predetermined position on the wire alignment substrate, the magnetic wire must be pulled out to take a straight line form prior to placement to the predetermined position. However, cares must be taken so as not to induce additional stresses in the magnetic wire to avoid the degrading of the magnetic properties of the magnetic wire. This can be achieved by introducing a wire tensile force loading device that applies a controlled tensile force to the magnetic wire when the magnetic wire, which has been heat treated under tension, is pulled out in a form of straight line from the wire bobbin by the wire chuck. This allows for strict control of the tensile force aligned along the longitudinal direction of the magnetic wire.

Specifically, the mechanical properties of the magnetic wire, such as elastic limit stress, are determined prior to the wire alignment, and the stress induced to the magnetic wire is adjusted to be within the elastic limit stress. This can be achieved also by introducing the wire tensile force loading device. The fine adjustment of the stress of the magnetic wire is extremely important because the superfine wire can be elongated beyond the elastic limit or broken apart even with a very small variation of the tensile force applied to the magnetic wire. The wire tensile force loading device prevents not only the breakage of the wire but also degrading of the magnetic properties of the magnetic wire while keeping the magnetic wire in a straight line form.

Second, it is extremely difficult to align a magnetic wire having a diameter of, for example about 10 to 30 μm with a predetermined position on the wire alignment substrate in an accurate manner, especially when the width of the predetermined position is only slightly larger than the diameter of the magnetic wire to be aligned with the predetermined position. In view of this, the position of the magnetic wire that is pulled out to take a straight line form, and not a marker on the substrate side, is set as the reference line for the wire alignment, and a misplacement detection device is introduced to detect accurately the misplacement between the reference line of the magnetic wire and the base line on the wire alignment substrate that corresponds to the predetermined position with which the magnetic wire is aligned. In order to correct the misplacement, a position adjustment device is introduced to the substrate attaching base to which the wire alignment substrate is attached. That is, the position adjustment device can move horizontally and vertically and can rotate so as to adjust the position of the substrate attaching base in order to align the reference line of the magnetic wire pulled out to be under the proper tension with the base line on the wire alignment substrate, while the wire alignment substrate is attached to the substrate attaching base. The idea of this approach is that it is very difficult to move around the superfine magnetic wire. Rather, it is easier to move the wire alignment substrate, not the wire, so that the base line of the wire alignment substrate moves to the reference line of the magnetic wire that is not moved during the alignment.

Third, the magnetic wire must be cut after it is aligned with a predetermined position of the wire alignment substrate. This is because the magnetic wire needs to be aligned with another predetermined position, i.e., another base line, of the wire alignment substrate after the initial alignment. Cutting of the magnetic wire may dislodge the wire, which has been aligned with the predetermined position, from the corresponding base line of the wire alignment substrate. If this happens, the alignment must be redone, and mass production of the magnetic sensor become impossible.

In view of this, the substrate attaching base includes a magnetic power generation device. Because of the magnetic power generation device, the magnetic wire remains at the predetermined position of the wire alignment substrate during and after the cutting of the magnetic wire. In particular, torsional stresses are not induced in the magnetic wire during the cutting, because the magnetic power generation device attaches the magnetic wire to the wire alignment substrate along the base line with a force that is essentially the same throughout the length of the cut magnetic wire.

In short, with the apparatus descried above, the base line corresponding to the predetermined position of the wire alignment substrate, with which a magnetic wire is to be aligned, is moved, by the horizontal, vertical and rotational movement of the substrate attaching base to which the wire alignment substrate is attached, to be aligned accurately with the reference line of the magnetic wire that has been heat treated under application of tensile force and is pulled out from the wire bobbin to take a straight line form and to be at a proper stress generated by the wire tensile force loading device. Further, the magnetic power generation device of the substrate attaching base holds the cut magnetic wire at the predetermined position of the wire alignment substrate so that the reference and base lines remain aligned, assuring that no additional stresses, such as torsional stresses, are induced in the magnetic wire and thus enabling mass production of magnetic sensors with superfine magnetic wires, such as MI sensors and orthogonal fluxgate sensors. The apparatus for aligning magnetic wire allows for alignment of multiple magnetic wires in the same magnetic sensing element and manufacturing of small size magnetic sensors in which superfine magnetic wires are aligned accurately at a very fine interval, enabling mass production of small high performance magnetic sensors.

DETAILED DESCRIPTION OF THE INVENTION

Figure 1:
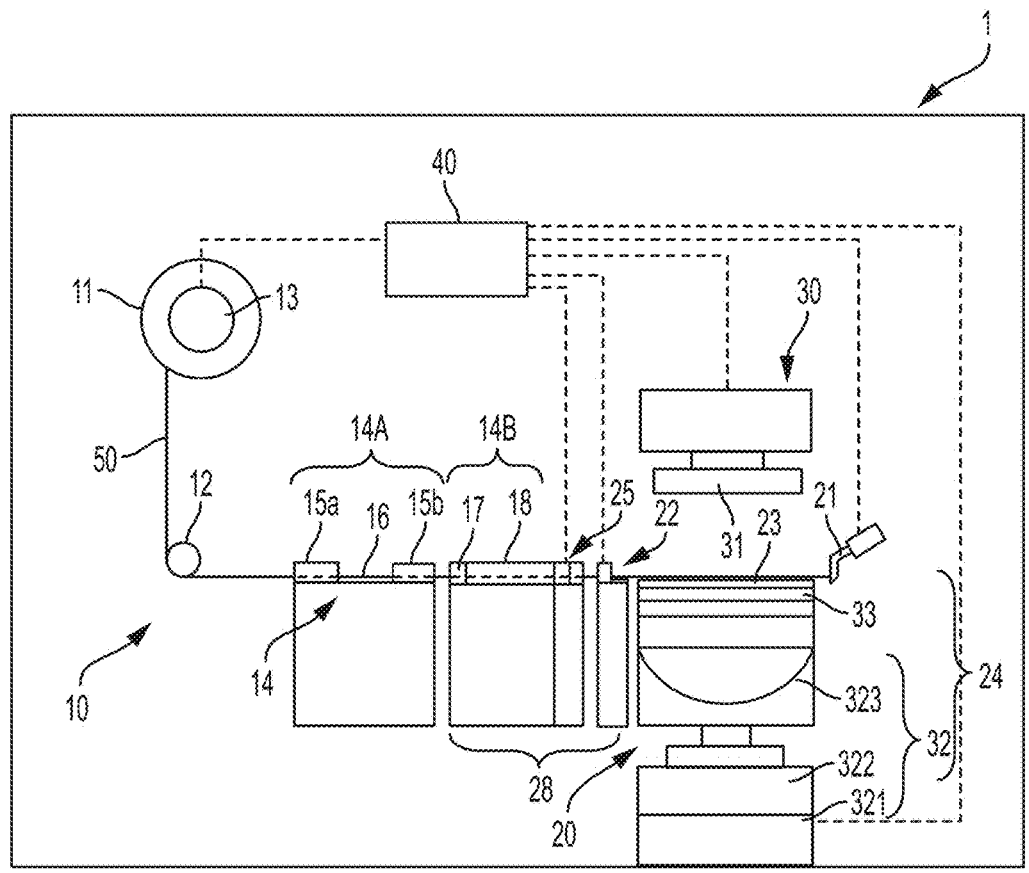
FIG. 1 is a conceptual front diagram showing the construction of apparatus for aligning magnetic wire of an embodiment.

The apparatus for aligning magnet wire is described below in detail. The apparatus includes a wire supply device, a wire alignment device, a misplacement detection device and a control device. First, the components of the apparatus are described separately.

The wire supply device preferably has the following features. The apparatus for aligning magnetic wire is supplied with magnetic wires that have been already heat treated under application of tensile force and wound around a wire bobbin. Again, it is noted that the magnetic wires for this apparatus are superfine and may break even when a person slightly pull them inadvertently. In the apparatus, the wire chuck pulls out the magnetic wire, which has been already heat treated, from the wire bobbin in a form of straight line under proper tension. If the tensile force applied to the magnetic wire being pulled out is too small, the alignment of the magnetic wire becomes difficult because the magnetic wire fails to take a form of straight line, which provides the reference line for the alignment. On the other hand, if the tensile force is too large, the magnetic wire may elongate beyond the elastic limit or break.

Accordingly, the wire supply device has a wire tensile force loading device that can apply a predetermined tensile force to the magnetic wire. The predetermined tensile force is determined based on the mechanical properties and the diameter of the magnetic wire. The use of the wire tensile force loading device makes sure that the magnetic wire is pulled out from the wire bobbin by the wire chuck in a form of straight line under tension without causing irreversible elongation or break of the magnetic wire since the tensile stresses induced in the magnetic wire are within the elastic limit.

The wire tensile force loading device may be placed between the wire bobbin and the wire reel or between two wire reels. The wire tensile force loading device may also be integrated with the wire bobbin in a detachable manner. Any other alignment may be used as long as it can adjust the applied tensile force properly and accurately. In this context, a wire bobbin refers to a cylinder-shaped component, around which the magnetic wire that have been heat treated under application of tensile force is wound, and a wire reel refers to a rotatable component that is used to lead the magnetic wire toward the wire alignment substrate.

The wire supply device also has the wire holding part, and the wire alignment device has an intermediate wire holding part. The two wire holding parts and the wire chuck operate in concert to make sure that no additional stresses, other than those intentionally induced during the heating prior to the wire alignment, are induced in the magnetic wire during the alignment on the wire alignment substrate. They are designed not to apply uncontrollable force directly to the magnetic wire during the alignment, as explained below. As a result, the degrading of the magnetic properties of the magnetic wires can be prevented.

In fact, the wire holding part, the intermediate wire holding part and the wire chuck are the three main components of the apparatus that could apply uncontrollable, external direct force to the magnetic wire if no preventative measures are taken. In this context, an intermediate wire holding part refers to a component that holds the magnetic wire at a position between the wire alignment substrate and the cutter, including the position of cutting. A wire holding part refers to a component that holds the magnetic wire at a position between the wire bobbin and the cutter.

Among the three components, the wire chuck needs to grip the magnetic wire and thus requires direct contact with the magnetic wire. The two wire holding parts may also employ a chuck (i.e., the direct grip) to hold the magnetic wire at respective positions. However, grooves may be provided as a wire guide, which can restrict horizontal and vertical movement of the magnetic wire. Further, the magnetic wires may be held at the respective positions by magnetic force in addition to the wire guide. The combination of the wire holding part of the wire supply device and the intermediate wire holding part of the wire alignment device allows for stable holding of the pulled out magnetic wire at respective positions and accurate alignment of the magnetic wire and the wire alignment substrate.

In particular, the magnetic wire is led from the wire bobbin into the grooves on the wire holding parts while being held down to magnets placed along the path of the magnetic wire being sent to the wire alignment substrate. In this configuration, no major external force is applied to the magnetic wire along the path to the wire alignment substrate because the magnetic wire is not griped by a chuck but is guided only by free contact between the inner surface of the grooves as the wire guide and the surface of the magnetic wire. When magnets are employed to hold down the magnetic wire, the magnetic wire may be in direct contact with the magnet. However, again no major external force is applied to the magnetic wire because the magnetic wire is not griped by a chuck.

The combination of the wire guide and the magnets assures stable holding of the reference line of the magnetic wire at a predetermined position. After the reference line of the magnetic wire is aligned with the base line of the magnetic wire alignment substrate, the deviation in horizontal and vertical position of the magnetic wire can be suppressed by the wire guide and the magnets provided in each of the wire holding part and the intermediate wire holding part.

Alternatively, only wire guides may be provided to the two wire holding parts. The wire guides in both wire holding parts are designed to restrict horizontal movement of the magnetic wire, while the wire guide of the wire holding part is designed to restrict upward movement of the magnetic wire and the wire guide of the intermediate wire holding part is designed to restrict downward movement of the magnetic wire. Thus, the wire guides alone can restrict the horizontal and vertical movement of the magnetic wire.

When a wire chuck is employed to hold the magnetic wire at the two wire holding parts, direct external force may be applied to the magnetic wire, thus changing the magnetic properties of the magnetic wire. However, not all parts of the magnetic wire are aligned on the wire alignment substrate to become part of a magnetic sensor, and some parts are simply cut out. Accordingly, a wire chuck may be employed in the two wire holding parts, as long as the portion of the magnetic wire that has been gripped by the wire chuck is not included as the magnetism detecting body in a magnetic sensor.

In some case, the portion of the magnetic wire held by the wire holding part when the leading portion of the magnetic wire is aligned on the wire alignment substrate may be led into the middle of the wire alignment substrate during the next alignment, although the portion of the magnetic wire held by the intermediate wire holding part may become the portion of the magnetic wire gripped by the wire chuck in the next alignment. In such a case, the combination of the wire guide and magnets, described above, may be used to avoid application of direct external force to the portion of the magnetic wire that becomes the magnetism detecting body of a magnetic sensor.

The use of the combination of the wire guide and magnets allows for the use of the portion of the magnetic wire that has been held by the wire holding parts as the magnetism detecting body in a magnetic sensor, when that portion is led to the wire alignment substrate, thus reducing the amounts of the magnetic wire that must be discarded and improving yield of the production of a magnetic sensor. Some magnetic wires are easier to be handled by physically gripping them. For such magnetic wires, the wire alignment is designed such that the portion of the magnetic wire that has been physically gripped is positioned outside the wire alignment substrate.

The wire alignment device also includes a cutter that cuts magnetic wires. It may be a mechanical cutter, which is provided separately from the two wire holding parts. In some case, the mechanical cutter may be combined with the intermediate wire holding part. In particular, the mechanical cutter includes a stationary blade and a movable blade. The stationary blade has a groove having a width that is just enough for the magnetic wire to pass through and yet properly restrict the movement of the magnetic wire in the width direct of the groove. The movable blade has a groove of a similar width and slides against the stationary blade so that the magnetic wire held by the grooves of the two blades is cut apart. The intermediate wire holding part may operate as the stationary blade or may be provided separately from the stationary blade.

The magnet used at the wire holding part and the intermediate wire holding part for holding down the magnetic wire may be in direct contact with the magnetic wire, so that the reference line of the magnetic wire is aligned with and held at the base line of the wire alignment substrate in a stable manner, as explained above. In other words, the magnets and the grooves may be placed separately at different positions of the path of the magnetic wire. Alternatively, a magnet is provided as a sheet and attached to the backside of the material forming the grooves having a width for guiding the magnetic wire in a manner similar to the grooves discussed above. The magnets to hold down the magnetic wire at the two wire holding parts do not have to be as powerful as the magnets used at the wire alignment substrate. Adoringly, sheets magnets, such as ferrite sheet rubber may be used, although such magnets are not strong as alloy magnets, such as samarium-cobalt magnets.

The apparatus for aligning magnetic wire can be designed to pull out more than one magnetic wire at the same time and align them on a wire alignment substrate. This design is preferable because the productivity of magnetic sensors is improved. Under this design, the same number of the wire supply devices as the multiple magnetic wires pulled out at the same time are provided to the apparatus. Likewise, both the wire holding part and the intermediate wire holding part are modified to hold the multiple magnetic wires at the same time. For example, the number of the grooves must be the same as the number of the magnetic wires. Preferably, the reference lines of the multiple wires pulled out at the same time by the wire chucks lay on the same plane, and the interval of the multiple magnetic wires laying on the plane is an integer multiple of the distance of the two neighboring base lines of the wire alignment substrate. This configuration enables alignment of the multiple reference lines of the multiple magnetic wires with the corresponding multiple base lines of the wire alignment substrate accurately at the same time.

The fact that the interval of the multiple magnetic wires is an integer multiple of the distance of the two neighboring base lines of the wire alignment substrate means that the magnetic wires do not need to be aligned with the two neighboring base lines of the wire alignment substrate at the same time. Since the wire alignment substrate has a large number of alignment positions to receive the magnetic wires (i.e., the base lines of the wire alignment substrate), the wire alignment sequence is repeated for a number of times, so that all alignment positions have received the magnetic wires at the end of the repetition of the alignment sequence. In this manner, the distance between the magnetic wires is adjusted so that, for example, the wire chucks pulling out the magnetic wires at the same time do not mechanically interfere with each other.

In some case, multiple magnetic wires need to be aligned in the same magnetic element. Naturally, the interval between the magnetic wires in the same element is smaller than the interval between the two magnetic elements. When a magnetic element has two magnetic wires, the magnetic wires are aligned with first alignment positions of the magnetic elements, for example, the positions closer to the wire supply device, in the first sequence, and the magnetic wires are aligned with second alignment positions of the magnetic elements, for example, the positions further from the wire supply device, in the second sequence. In this manner, the magnetic wires can still be aligned at one sequence based on the interval between the two magnetic elements. All the alignment positions of the wire alignment substrate receive corresponding magnetic wires at the completion of the all alignment sequences.

The wire alignment device also includes the substrate attaching base that includes the magnetic power generation device that generate magnetic power to have the magnetic wire adhere to the base line on the wire alignment substrate after the cutting of the magnetic wire. Preferably, the magnetic power generation device includes multiple magnets of a column shape that are arranged side by side and perpendicular to the base line of the wire alignment substrate and embedded in an iron yoke to form an array of magnets. In particular, the N pole and the S pole of the magnets are arranged alternately to each other.

The arrayed magnets must be designed so that proper magnetic power for having the cut magnetic wire adhere to the wire alignment substrate is generated regardless of the position of the wire alignment substrate along the base line. Any type of magnet may be used for the arrayed magnet, as longs as it produces proper magnetic power for magnetic adhesion on the wire alignment substrate. A permanent magnet may be used, and an electromagnet may also be used. However, samarium-cobalt magnets, which are strong permanent magnets and can operate stably under high temperature, are preferable, because the magnetic wire must remain aligned with the base line after the cutting without deviating from the original position and must undergo a resin curing step in which the magnetic wire is fixed under heating.

The base line of the wire alignment substrate, which indicates the predetermined position of the alignment substrate for the wire alignment, may be a groove formed on the wire alignment substrate, which has a width slightly greater than the diameter of the magnetic wire. Alternatively, the base line of the wire alignment substrate may be a multiple pair of posts in which two posts of each pair are each formed on corresponding sides of the base line as a guide for the magnetic wire, which has a width slightly greater than the diameter of the magnetic wire. The posts may be formed by photolithographic techniques. The number of the posts may be determined based on the size of the wire alignment substrate and the proper alignment of the magnetic wire on the substrate. The line connecting the centers of the two pared posts is the base line of the wire alignment substrate.

The substrate attaching base, which includes the magnetic power generation device, needs to move with a positioning accuracy of about ±1 µm, because it must move the wire alignment substrate so that the base line of the wire alignment substrate is aligned with the reference line of the superfine magnetic wire having a diameter of, for example, about 10 to 30 µm that has been pulled out to take a straight line form.

Furthermore, in order to raise efficiency of mass production of magnetic wires, one wire alignment substrate needs to carry a large number of magnetic elements, such as MI elements, arranged in a predetermined pattern, so as to produce multiple magnetic elements from one wire alignment substrate. Accordingly, the substrate attaching base needs to move by the distance corresponding to the interval between two neighboring magnetic elements on the wire alignment substrate, i.e., about 100 to 800 µm, after one magnetic element receives the magnetic wire and before the neighboring magnetic element receives the magnetic wire, until all the magnetic elements receive the magnetic wire. This long range movement must be also controlled accurately.

Accordingly, the moving mechanism of the substrate attaching base preferably has separate mechanisms for vertical movement, horizontal movement and rotational movements, including both rotation around a horizontal axis and a rotation around a vertical axis, so that the alignment of the reference and base lines can be easily achieved.

The wire alignment substrate on which the magnetic wires are aligned and fixed temporarily by the apparatus for aligning magnetic wire is transferred to a downstream process for further processing. Accordingly, it is preferable that the magnetic power generation device of the substrate attaching base is detached from the apparatus together with the wire alignment substrate as a unitary component. This construction allows for transfer of the wire alignment substrate to the downstream process while the cut magnetic wires are temporarily fixed to the substrate by the magnetic power. In this regard, it is preferable to use permanent magnets for the magnetic power generation device, because permanent magnets provide stable magnetic power without supply of electric power.

The misplacement detection device preferably has the following features. The misplacement detection device helps alignment of the reference line of the magnetic wire and the base line of the wire alignment substrate by detecting the misplacement between the reference and base lines. The misplacement detection device includes an image expanding device, such as a microscope, provided in the vicinity of the wire alignment substrate, in order to detect the misplacement between the reference and base lines, the former corresponding to the magnetic wire that has been pulled out under application of tensile force to take a form of a straight line, and the latter formed on the wire alignment substrate attached to the substrate attaching base. Based on the detected misplacement, the substrate attaching base is moved by the position adjustment device so that the reference and base lines are aligned without misplacement.

Even when multiple magnetic wires are aligned on the wire alignment substrate at the same time, the misplacement between the reference and base lines needs to be detected and corrected with respect to only one magnetic wire. This is because the wire guides, such as the grooves and the posts, are formed at the predetermined positions of the wire alignment substrate corresponding to the interval between the magnetic elements on the wire alignment substrate, and the interval of the multiple magnetic wires pulled out from the wire supply devices at the same time is an integer multiple of the distance of the two neighboring base lines of the wire alignment substrate. As such, a precise alignment of only one magnetic wire results in alignment of all magnetic wires.

In the first alignment sequence, at the time of the first misplacement detection and position adjustment to correct the misplacement using the misplacement detection device and the position adjustment device of the substrate attaching base, the adjusted position, which is the position of the substrate attaching base after the correction of the misplacement, is stored in the control device. In the subsequent alignment sequences, the magnetic wire is pulled out to the same position as the first alignment sequence, and then the substrate attaching base is moved to the adjusted position of the first alignment sequence stored in the control device. Thereafter, the substrate attaching base is further moved based on the interval between the magnetic elements on the wire alignment substrate. This way, the alignment of the reference and base lines is efficiently performed without additional misplacement detection and position adjustment in the subsequent alignment sequences. The first and only misplacement detection and position adjustment may be performed by an operator, followed by automatic operation of the subsequent alignment sequences. If the misplacement detection and position adjustment are performed using image processing techniques, the entire automatic operation of the whole sequences is achieved.

As described above, the magnetic wire has a diameter of, for example, about 10 to 30 μm. Accordingly, the image expanding device, such as a microscope, preferably has a resolution of 1 μm or better. It is again emphasized that the apparatus moves the wire alignment substrate, and not the superfine magnetic wire that is difficult to handle, in order to align the reference line of the magnetic wire and the base line of the wire alignment substrate.

The apparatus for aligning magnetic wire is directed to mass production of magnetic elements. To this ends, the wire alignment device includes a cutter that cuts magnetic wires. That is, as soon as a magnetic wire is aligned on a wire alignment substrate in an alignment sequence, the magnetic wire is cut for the next alignment sequence. The cutter may be a pair of cutting blades (i.e., a stationary blade and a movable blade), a pair of scissors or a laser device. As explained above, when a pair of stationary and movable blades is used as the cutter, the groove formed in the stationary blade may also operate as the intermediate wire holding part, because the groove can restrict horizontal movement of the magnetic wire. On the other hand, when a pair of scissors or a laser device is used as the cutter, an intermediate wire holding part needs to be provided, because they do not operate as a wire holding part. In some case, an intermediate wire holding part may be provided in addition to the stationary blade, even when a pair of stationary and movable blades is used as the cutter.

During the cutting of the magnetic wire explained above, the magnetic wire is held down to the wire alignment substrate by magnetic power generated by the magnetic power generation device, which is equal along the longitudinal direction of the magnetic wire. Accordingly, the internal stresses induced in the magnetic wire are equal along the longitudinal direction of the magnetic wire during the cutting, and torsional stresses are not generated in the magnetic wire. Thus, stresses that degrade the magnetic properties of the magnetic wire are not generated during the cutting.

The control device preferably has the following features. The control device includes a processor and a memory that has a program stored therein, which implements those features when executed by the processor.

The magnetic wire is pulled out by the wire chuck from the wire bobbin under application of tensile force applied by the wire tensile force loading device so as to take a form of a straight line, and the magnetic wire is held by the wire holding part and the intermediate wire holding part in a predetermined position without errors. Since the wire takes a form of a straight line, the magnetic wire can be used as the reference line for the alignment.

Then, the substrate attaching base, to which the wire alignment substrate is attached, is moved by the position adjustment device, horizontally, vertically or rotationally, as necessary, so that the reference line of the magnetic wire is substantially aligned with the base line of the wire alignment substrate. In this context, substantial alignment means that the reference line and the base line are aligned such that the magnetic wire can be pulled into the predetermined positions of the wire alignment substrate by the magnetic power of the magnetic power generation device. In other words, a slight misplacement that can be overcome the magnetic power is tolerable.

When the substrate attaching base is moved toward the magnetic wire for alignment of the reference line and the base line, the substrate attaching base may be moved parallel to the reference line of the magnetic wire. Alternately, the substrate attaching base may be inclined with respect to the reference line such that one end of the base, such as the end on the wire supply device side, is closer to the magnetic wire. The substrate attaching base taking this posture is moved to the magnetic wire and then is brought back to the parallel position.

After the alignment of the reference line and the base line is completed, the magnetic wire adheres to the wire alignment substrate along its base line because of the magnetic power of the magnetic power generation device. The magnetic wire is cut by the cutter while it is held by the wire alignment substrate. The holding of the magnetic wire by the two wire holding parts and the wire chuck may be maintained until the magnetic wire is cut, or released before the cutting as long as the magnetic wire is held at the predetermined position of the wire alignment substrate by the magnetic power after the alignment of the reference line and the base line.

At the time of cutting the magnetic wire, the portion of the magnetic wire, which has been cut away from the magnetic wire aligned on the wire alignment substrate, must remain at the same position. Otherwise, it would be difficult to grip that portion by the wire chuck for the next alignment sequence. Specifically, the tip of the remaining magnetic wire may be displaced by the movable blade during the cutting. This displacement could be in the longitudinal direction of the magnetic wire or the direction perpendicular to the longitudinal direction. In order to prevent such displacement, the holding mechanism of the wire holding part, such as the power of the magnets placed in the wire holding part near the location of the cutting, must be optimized.

Even when the holding of the magnetic wire by the wire holding parts is released before the cutting, if the intermediate wire holding part operates as the stationary blade, the holding by the intermediate wire holding part must be released after the cutting. In addition, if the tensile force applied to the magnetic wire by the wire tensile force loading device is maintained during the cutting, the portion of the magnetic wire, which has been cut away from the magnetic wire aligned on the wire alignment substrate, may be pulled back to the wire supply device side at the time of the cutting the wire. Accordingly, the application of the tensile force to the magnetic wire is temporarily stopped just prior to the cutting of the magnetic wire. After the cutting, the same tensile force is again applied to the magnetic wire after the magnetic wire is griped by the wire chuck. Alternately, a wire chuck may be used to grip the magnetic wire at the location upstream of the location of the cutting. In this case, the temporary stopping of the application of the tensile force to the magnetic wire may not be necessary because the magnetic wire is not pulled back by the tensile force.

The program stored in the memory, when executed by the processor, controls the movements of the components of the apparatus described above. In short, the program controls the pulling out of the magnetic wire from the wire bobbin by the wire chuck, the movement of the substrate attaching base for the alignment of the reference line and the base line, release of the holding of the wire by the wire holding parts, and cutting of the magnetic wire, among other things. It is important that the program is prepared to perform these features accurately.

In order to take advantage of the features described above, a large number of magnetic elements are placed on the wire alignment substrate with predetermined intervals, and multiple magnetic wires are arranged with a predetermined interval, which corresponds to the interval between the two neighboring magnetic elements. In some case, multiple magnetic wires are aligned in one magnetic element. For example, multiple magnetic wires are aligned in one coil, or multiple magnetic wires are connected in parallel or in series, each inserted into a coil. The examples of the multiple wire alignment in one magnetic element are described in U.S. Pat. No. 8,587,300 (see for example FIGS. 12 and 13). Preferably, the program can control various combinations of advancement pitch of the substrate attaching base based on the interval between the two neighboring magnetic elements. As already described above, the distance between the two magnetic wires that are pulled out at the same time in one alignment sequence does not have to be the same as the interval between the two neighboring magnetic elements on the wire alignment substrate. Rather, it only needs to an integer multiple of the interval because it is sufficient that all base lines receive corresponding magnetic wires at the completion of all alignment sequences.

The wire alignment device is provided with a swing mechanism. The substrate attaching base can move horizontally, vertically, and rotationally in an accurate manner so that the base line of the wire alignment substrate is aligned with the reference line of the magnetic wire taking the straight line form, as discussed above. However, in practice, some fairly small amount of misplacement between the reference line and the base line may occur despite the alignment by the movement of the substrate attaching base. For example, the formation of the grooves and the posts as wire guides on the wire alignment substrate may have small error margins, but they may be significant for the magnetic wire alignment. The manufacturing of apparatus for aligning magnetic wire as a whole may also have small error margins in some aspects, but they may be significant for the magnetic wire alignment. For example, the distance between two magnetic wires pulled at the same time may have a small but non-negligible deviation from the specification. Accordingly, some of the magnetic wires being aligned at the same time may be misplaced a little from corresponding base lines of the wire alignment substrate, for example, the grooves or the paired posts, while multiple wire are aligned at the same time. It is note that the little displacement discussed here is not larger than the width of the grooves or the distance between the paired posts. The swing mechanism corrects this small amount of displacement.

The swing mechanism generates a swing of amplitude smaller than or equal to the width of the grooves or the distance between the paired posts. The swing mechanism is activated to vibrate the wire alignment substrate while the substrate attaching base is elevated. Even if the small amount of the misplacement occurs due to the reasons explained above, the vibration smoothly drives down the magnetic wire into the grooves, thus into the predetermined position of the wire alignment substrate (i.e., the base line). The same effect is obtained from the paired posts. In other words, the swing mechanism provides alignment effects that are similar to that of slanted surface of the grooves. The magnetic power of the magnetic power generation device helps the swing mechanism to lead slightly misplaced magnetic wire into the predetermined position by pulling down the magnetic wire from under the wire alignment substrate.

The magnetic wire is fixed to the wire alignment substrate by the magnetic power of the magnetic power generation device after the magnetic wire is aligned with the base line of the wire alignment substrate and cut by the cutter. However, this is a temporary fixing of the magnetic wire onto the wire alignment substrate. Accordingly, permanent fixing of the magnetic wire is performed by applying resin to the wire alignment substrate including the magnetic wire and curing the resin.

The fixing of the magnetic wire with the resin is performed after the wire alignment substrate, on which the magnetic wires have been already aligned, is detached from the substrate attaching base together with the magnetic power generation device. When electromagnets, instead of permanent magnets, are used as the magnetic power generation device, the electromagnets must be kept activated.

At this point, the only external force applied to the magnetic wire is the magnetic power, because tensile force application by the wire tensile force loading device, the holding of the magnetic wire by the wire holding parts and the wire chuck have been already stopped at this point. Accordingly, performing the permanent fixing of the magnetic wire at this point assures that almost no uncontrollable and undesirable stresses, such as torsional stresses, are induced in the magnetic wire. The magnetic sensors with aligned magnetic wires manufactured by the apparatus do not have uncontrollable and undesirable stresses, such as torsional stresses, induced therein, and are not subject to degrading of the magnetic properties of the magnetic sensors, thus enabling mass production of magnetic sensors with superior qualities.

An embodiment of the apparatus for aligning magnetic wire is described below referring to FIGS. 1-18. The apparatus 1 includes a wire supply device 10, a wire alignment device 20, a misplacement detection device 30 and a control device 40. The wire supply device 10 includes a wire bobbin 11, a wire reel 12, a wire tensile force loading device 13 and a wire holding part 14.

Figure 14:
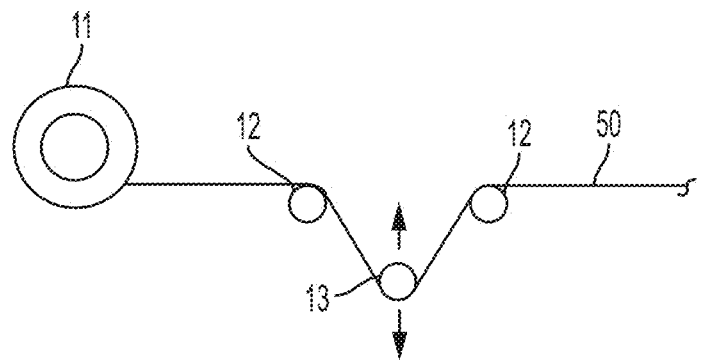
FIG. 14 is a front view of the wire supply device as an alternate to the wire supply device shown in FIG. 1.

The wire tensile force loading device 13 shown in FIG. 1 is a loading device that is detachable from the wire bobbin 11 and controls the tensile force applied to the magnetic wire 50 through wire bobbin 11. Alternately, as shown in FIG. 14, the tensile force loading device 13 may be provided separately from the wire bobbin 11 between two wire reels 12 in order to control the tensile force applied to the magnetic wire 50. The tensile force applied by the wire tensile force loading device 13 is determined so that the stresses induced in the magnetic wire 50 is lower than the elastic limit. The magnetic wire 50 pulled out from the wire bobbin 11 is transferred to the wire holding part 14 though the wire reel 12.

Figure 8:
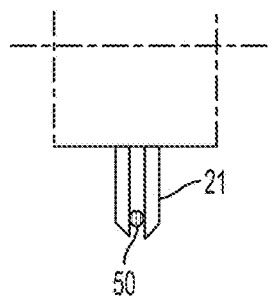
FIG. 8 is a side view of the wire chuck for pulling out the wire of the apparatus of FIG. 1, viewed from the longitudinal direction of the magnetic wire.
Figure 15:
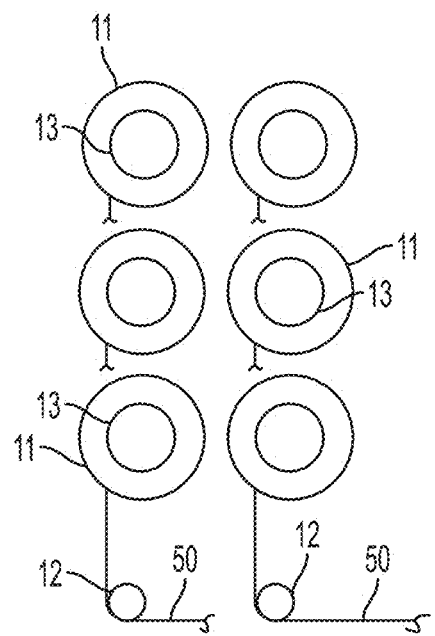
FIG. 15 is a front view of the wire supply device as another alternate to the wire supply device shown in FIG. 1.

In this embodiment, for improving productivity, six magnetic wires 50 are aligned with corresponding six base lines of a wire alignment substrate 23, which are grooves 231 formed on the wire alignment substrate 23, at the same time in one alignment sequence. Since six magnetic wires 50 are pulled out for the alignment at the same time, the wire supply device 10 includes six wire bobbins 11, six wire reels 12, and six wire tensile force loading devices 13, as shown in FIG. 15. The wire supply device 10 also includes a wire holding part 14 that can hold six magnetic wires 50, in the manner shown in FIGS. 2-4, at the same time. These six magnetic wires 50 are aligned at the same time with the six base lines of the wire alignment substrate 23. The wire alignment device 20 also includes six wire chucks 21, an intermediate wire holding part 22 that can hold six magnetic wires 50 at the same time, and a cutter 25 that can cut six magnetic wires 50. The wire chuck 21 of this embodiment can grip the magnetic wire 50 directly, as shown in FIG. 8. It is noted that the description below focuses on alignment of one of the six base lines and its corresponding reference line so as to avoid redundant explanations.

Figure 2:
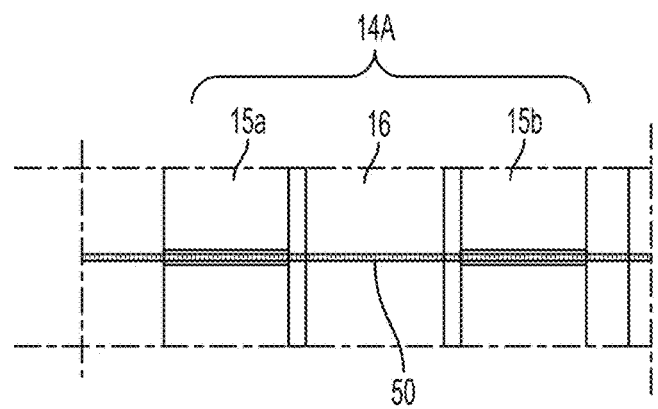
FIG. 2 is a plan view of the upstream portion of the wire holding part of the apparatus of FIG. 1.
Figure 3:
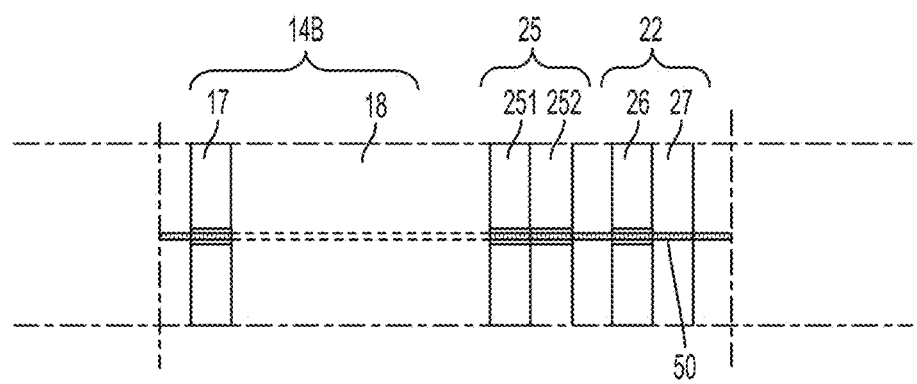
FIG. 3 is a plan view of the downstream portion of the wire holding part, the cutter and intermediate wire holding part of the apparatus of FIG. 1, while the magnetic wire is held in the apparatus.

FIGS. 2 and 3 show the wire holding part 14 of the wire supply device 10. The wire holding part 14 is a holding device placed upstream of a cutter 25 for preventing misplacement of the magnetic wire 50 and includes upstream holding part 14A holding an upstream portion of the magnetic wire 50 and downstream holding part 14B holding a downstream portion of the magnetic wire 50.

As shown in FIG. 2, the upstream holding portion 14A includes a pair of guide portion 15a and 15b, each of which has a groove, having an opening facing upward, which the magnetic wire 50 can pass through. In FIG. 2, the groove is shown as a channel receiving the magnetic wire 50. For example, when the diameter of the magnetic wire 50 is 30 μm, the width and the depth of the groove are about 50 μm. The upstream holding portion 14A also includes sheet magnet 16 placed between the guide portions 15a and 15b, which may be a ferrite sheet rubber magnet. When the chuck 21 pulls out the magnetic wire 50, the magnetic wire 50 passes through the guide 15a, adheres to the sheet magnet 16 while passing along its surface, and is transferred to the downstream holding part 14B through the guide portion 15b.

Figure 7:
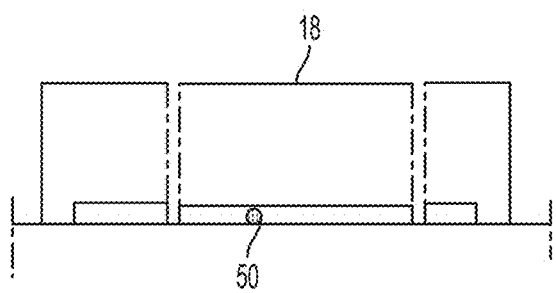
FIG. 7 is a side view of the cap portion of the wire holding part of the apparatus of FIG. 1, viewed from the longitudinal direction of the magnetic wire.

FIGS. 3 and 7 show the downstream holding part 14B. It is provided with a guide portion 17, which has a groove having a similar construction and size to the groove of guide portions 15a and 15b, and a cap portion 18, which can press the magnetic wire 50 downward with a force that does not induce stresses greater than the elastic limit of the magnetic wire 50. In FIG. 3, the groove is shown as a channel receiving the magnetic wire 50. The magnetic wire 50 is transferred to the cutter 25 through the groove of the guide portion 17 and underneath the cap portion 18.

The wire holding part 14 of this embodiment does not directly grip the magnetic wire 50. Rather, the wire holding part 14 is designed to hold the magnetic wire 50 in a gentler manner. This is a preferable embodiment. However, direct gripping by a mechanical device, such as a wire chuck, may be alternately employed in some case.

The wire alignment device 20 includes the wire chuck 21, the intermediate wire holding part 22, the wire alignment substrate 23, a substrate attaching base 24, and the cutter 25. FIGS. 1 and 3 show the intermediate wire holding part 22. As shown in FIG. 1, the intermediate wire holding part 22 is a holding device that is placed between the cutter 25 and the wire alignment substrate 23 and prevents misplacement of the magnetic wire 50 that is pulled out from the wire bobbin 11 by the wire chuck 21 with respect to the wire alignment substrate 23.

As shown in FIG. 3, the intermediate wire holding part 22 includes a guide portion 26, which has a groove, having an opening facing upward, which the magnetic wire 50 can pass through and has a width and depth of about 50 μm. The intermediate wire holding part 22 also includes a sheet magnet 27, which is made of ferrite sheet rubber magnet or the like and placed next to the guide portion 26. When the chuck 21 pulls out the magnetic wire 50, the magnetic wire 50 passes through the guide 26, adheres to the sheet magnet 27 while passing along its surface, and is transferred to the wire alignment substrate 23, so as to prevent misplacement of the magnetic wire 50.

The wire holding part 14, downstream holding portion 14B, intermediate wire holding part 22 and the cutter 25 are supported by a support base 28, which can move horizontally and vertically. The support base 28 retreats to a safe position so as not to interfere with the wire chuck 21, when the wire chuck 25 grips and pulls the tip of the magnetic wire 50 again after the cutting of the magnetic wire 50. After the magnetic wire 50 is pulled out to some extent, the support base 28 moves back to the operational position. When the holding of the magnetic wire 50 is released prior to the cutting of the magnetic wire 50, the downstream holding part 14B and the intermediate wire holding part 22 move to release the holding while the cutter 25 remains in the same position.

In the structure shown in FIGS. 2 and 3, the guide portions 15a, 15b and 17 and the sheet magnet 16 of the wire holding part 14 as well as the guide portion 26 and the sheet magnet 27 of the intermediate holding part 22 are provided as separate components. Alternately, some of these components may be combined together. For example, a plate having grooves on its top surface and a sheet magnet attached to its bottom surface may be used in lieu of the structure shown in FIGS. 2 and 3. Providing the guide portions 15a, 15b, 17 and 26 and the sheet magnets 16 and 27 at the wire holding part 14 and the intermediate holding part 22 enables a stable and secure holding of the magnetic wire 50 so as to present the magnetic wire as the reference line. In addition, they also help holding the magnetic wire 50 at the groove of the wire alignment substrate 23, which is the reference line, without misplacement, when the magnetic wire 50 is aligned on the wire alignment substrate 23.

Figure 4:
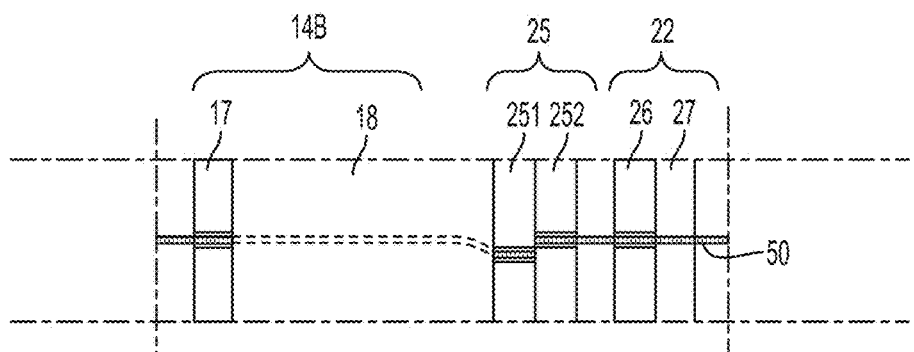
FIG. 4 is a plan view of the downstream portion of the wire holding part, the cutter and intermediate wire holding part of the apparatus of FIG. 1, while the magnetic wire is cut in the apparatus.
Figure 5:
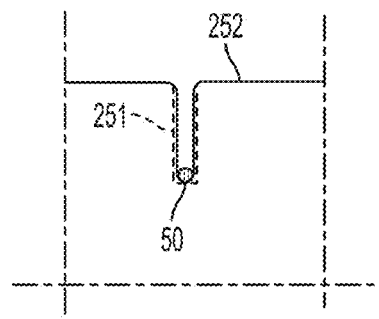
FIG. 5 is a side view showing the positions of the movable blade and the stationary blade of the cutter of the apparatus of FIG. 1, while the magnetic wire is held in the apparatus. The view is from the longitudinal direction of the magnetic wire.
Figure 6:
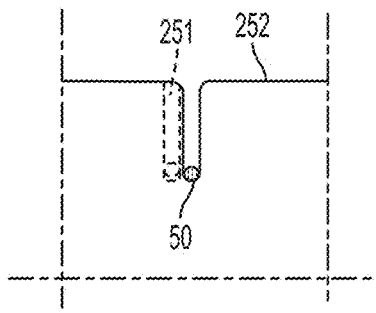
FIG. 6 is a side view showing the positions of the movable blade and the stationary blade of the cutter of the apparatus of FIG. 1, while the magnetic wire is cut in the apparatus. The view is from the longitudinal direction of the magnetic wire.

FIGS. 3-6 show the cutter 25, which is a mechanical cutter. The cutter 25 includes a movable blade 251 and a stationary blade 252, each of which has a groove that has a width a little greater than the diameter of the magnetic wire 50. The opposing faces of the two blades 251 and 252 are physically in contact with each other. When cutting the magnetic wire 50 in the groove, the movable blade 251 slides against the stationary blade 252 in the direction perpendicular to the longitudinal direction of the magnetic wire 50. In particular, FIG. 3, a plan view, and FIG. 5, a side view from the longitudinal direction of the magnetic wire, show the positioning of the two blades 251 and 252 at the time of the alignment of the magnetic wire 50. FIGS. 4 and 6, corresponding to FIGS. 3 and 5, respectively, show the positioning of the two blades 251 and 252 at the time of the cutting of the magnetic wire 50.

Figure 16:
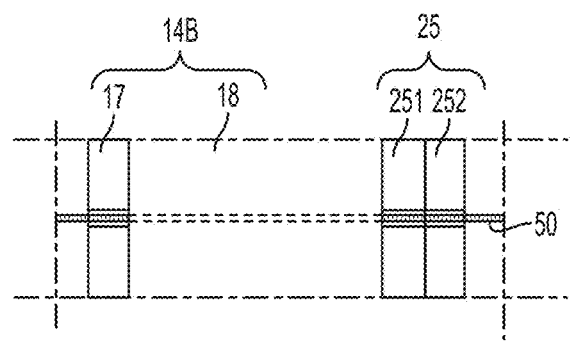
FIG. 16 is a plan view of the downstream portion of the wire holding part, the cutter and intermediate wire holding part as an alternate to the structure shown in FIG. 3.

In the structure shown in FIG. 3, the intermediate wire holding part 22 is provided in addition to the cutter 25. Alternately, the intermediate holding part 22 may be omitted, as shown in FIG. 16. In this configuration, the stationary blade 252 holds the magnetic wire 50 so as not to be misplaced from the base line. The stationary blade 252 can operate as an intermediate wire holding part because the groove restricts the horizontal movement of the magnetic wire 50.

The misplacement detection device 30 is shown in FIG. 1. The misplacement detection device 30 includes a microscope 31, which detects misplacement between the reference line, which is the magnetic wire 50 taking a form of a straight line under application of a tensile force, and the base line, which is the groove 231 of the wire alignment substrate 23 for the alignment of the reference line and the base line.

The substrate attaching base 24 is also shown in FIG. 1. The substrate attaching base 24 includes a magnetic power generation device 33 and a feeding device 32. The magnetic power generation device 33 includes a magnet 331 that can have the magnetic wire 50 adhere to the wire alignment substrate 23 after the magnetic wire 50 is aligned with the base line of the wire alignment substrate 23. The feeding device 32 includes horizontal feeding mechanism 321 for horizontal movement, a vertical feeding mechanism 322 for vertical movement and a rotation mechanism 323 for rotations around both a horizontal axis and a vertical axis.

The control device shown in FIG. 1 performs the following functions, among other functions: the pulling out of the magnetic wire 50; the positional adjustment of the support base 28 that supports the downstream supporting part 14B of the wire holding portion 14, the intermediate wire holding part 22 and the cutter 25; the elevation of the substrate attaching base 24 to the alignment position; the holding of the magnetic wire 50 by magnetic power; the cutting; the lowering and lateral movement of the substrate attaching base 24; and the adjustment of the tensile force applied to the magnetic wire 50 by the wire tensile force loading device 13.

Figure 11:
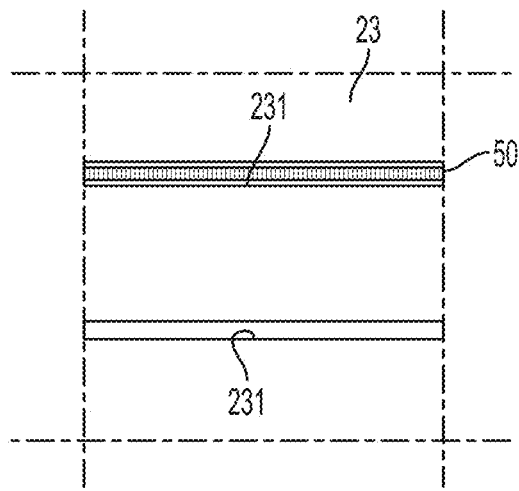
FIG. 11 is a partially expanded plan view of the wire alignment substrate of FIG. 9.
Figure 12:
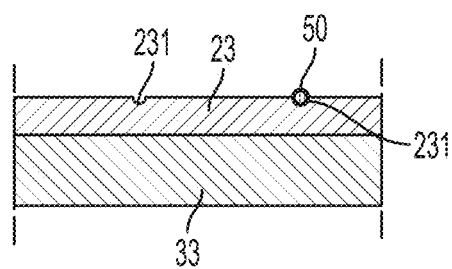
FIG. 12 is a partially expanded side view of the wire alignment substrate of FIG. 10.

FIGS. 11 and 12 show the wire alignment substrate 23, in which the grooves 231 are formed. FIG. 11 is a plan view, and FIG. 12 is a side view from the longitudinal direction of the magnetic wire 50. In each drawing, one groove is aligned with the magnetic wire 50, and the other is not.

The apparatus 1 described above and the wire alignment substrate 23 shown in FIGS. 11 and 12 were used to align the magnetic wire 50. The successful result was obtained. That is, the magnetic wire 50 was pulled out from the wire bobbin 11 of the wire supply device 10 by the wire chuck 21 through the wire reel 12 so as to take a form of a straight line that served as the reference line. The microscope 31 of the misplacement detection device 30 was able to observe and detect the separation between the reference line and the base line, which is the groove of the wire alignment substrate 23. The substrate attaching base 24 was able to move the wire alignment substrate 23 attached to it using the horizontal feeding mechanism 321, the vertical feeding mechanism 322 and the rotation mechanism 323 of the feeding device 32, so that the reference line and the base line were aligned without misplacement.

Figure 17:
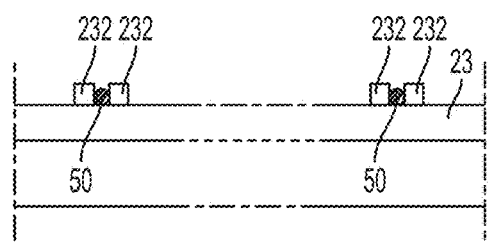
FIG. 17 is a side view showing the guide posts placed on the wire alignment substrate, which indicates the base line for alignment, of the apparatus of FIG. 1.
Figure 18:
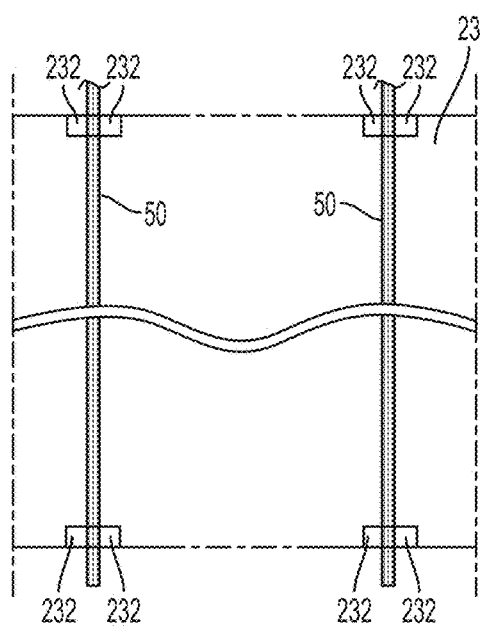
FIG. 18 is a plan view showing the guide posts placed on the wire alignment substrate, which indicates the base line for alignment, of the apparatus of FIG. 1. The length in the direction of the magnetic wire is shortened by the break in the middle of the drawing.

In the wire alignment substrate 23 shown in FIGS. 11 and 12, the grooves define the base lines. As an alternate, a group of paired posts 232 operating as a wire guide was formed on the wire alignment substrate 23 to define the base lines, as shown in FIGS. 17 and 18. The posts 232 were formed at least at two locations along the base line of a magnetic element, such as an MI element, by photolithography. The base line of the wire alignment substrate 23 is defined as the line connecting centers of the paired posts 232.

The magnetic wire 50 used was made by a rotating liquid spinning process, such as those disclosed in U.S. Pat. Nos. 4,527,614 and 4,781,771, and had a diameter of about 30 μm. It was a magnetic amorphous wire made of a CoFeSiB alloy.

Figure 19:
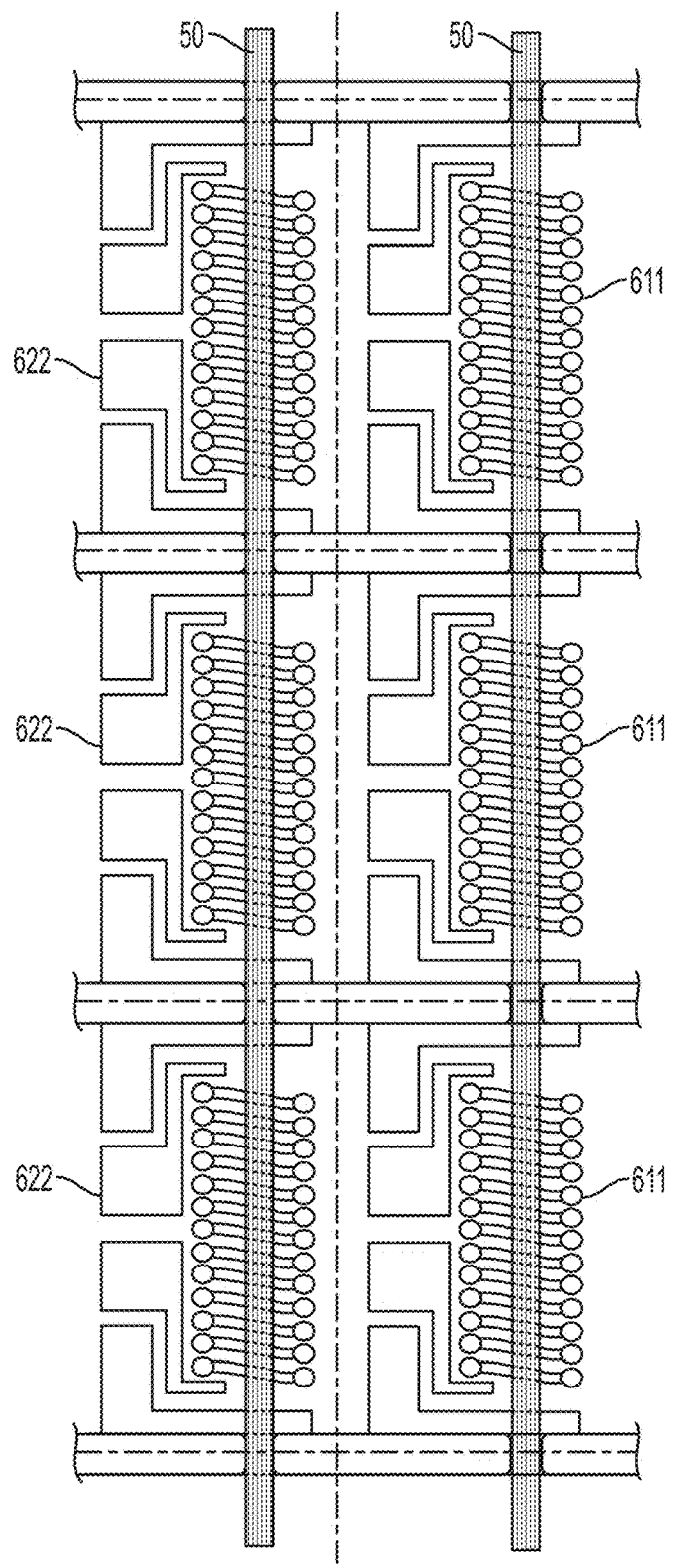
FIG. 19 is a plan view of the MI elements and the magnetic wires on the wire alignment substrate of the apparatus of FIG. 1.
Figure 20:
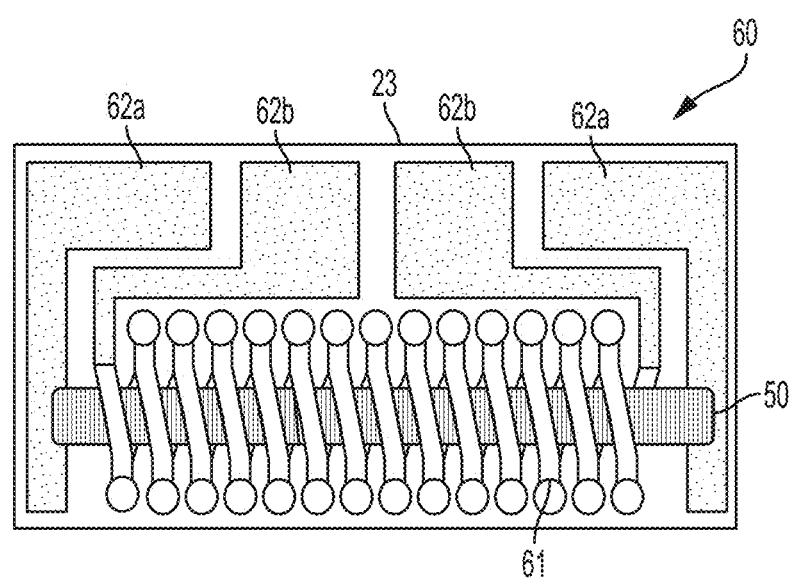
FIG. 20 is a plan view showing the MI sensor of FIG. 19.

The wire alignment substrate 23 used was made of silicon and a square of 60 mm×60 mm. On the wire alignment substrate 23, seventy two groves 231 having a width of 50 μm and a depth of 50 μm were formed with an interval of 700 μm. As shown in FIG. 19, the wire alignment substrate 23 also included bottom patterns 611 of a detection coil 61 and electrode wiring pattern 622 of an electrode 62 that were printed on the wire alignment substrate 23. FIG. 20 shows a final product produced using the wire alignment substrate 23 shown in FIG. 19. The MI element 60 includes the wire alignment substrate 23, the magnetic wire 50 aligned on the wire alignment substrate 23, the detection coil 61 surrounding the magnetic wire 50, a resin body (not shown in the drawing) holding the magnetic wire 50 and the detection coil 61, and an electrode 62*a* for the magnetic wire 50 and an electrode 62*b* for the detection coil 61 formed on the planar surface of the wire alignment substrate 23. The apparatus 1 for aligning magnetic wire described above was used to make the MI element 60 shown in FIG. 20.

Figure 9:
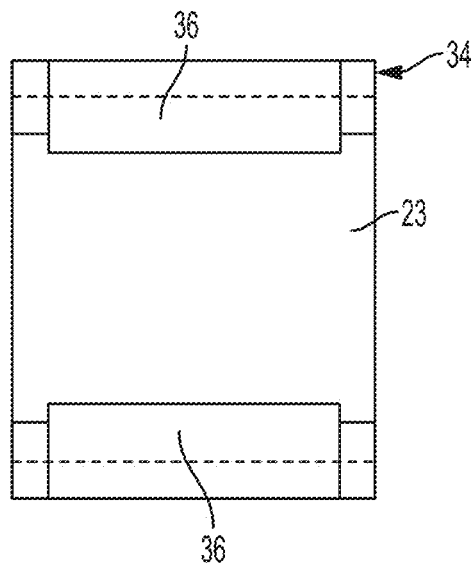
FIG. 9 is a plan view showing the wire alignment substrate, including the magnetic power generation device, and the jig for the substrate of the apparatus of FIG. 1.
Figure 10:
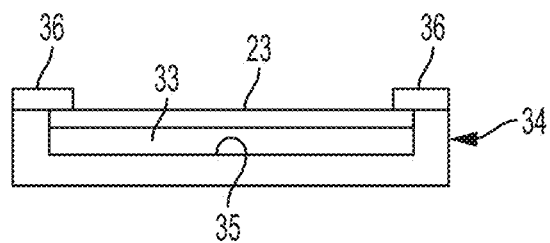
FIG. 10 is a side view showing the wire alignment substrate, the magnetic power generation device and the jig for the substrate of the apparatus of FIG. 1.

As shown in FIGS. 9 and 10, the wire alignment substrate 23 and the magnetic power generation device 33 were attached to the substrate attaching base 24 using a fixing device 34. The fixing device 34 has a housing portion 35, in which the wire alignment substrate 23 and the magnetic power generation device 33 are contained, and a pair of claws 36, which holds down the wire alignment substrate 23 so as not to interfere with the grooves 231 formed on the surface of the wire alignment substrate 23 and the wire chuck 21 that moves to pull the magnetic wire 50. As a result, the wire alignment substrate 23 and the magnetic power generation device 33 becomes a unitary component.

Again, it is emphasized that the wire tensile force loading device 13 is an important component of the apparatus 1 for aligning magnetic wire. That is, the device is required to apply a proper tensile force to the magnetic wire 50 so as to have a form of a straight line, without any slack, when it is pulled out by the wire chuck 21. Yet, the tensile force must be controlled so that the stresses induced in the magnetic wire 50 are within the elastic limit of the magnetic wire 50 so as not to alter the proper magnetic properties of the magnetic wire 50.

A test for magnetic wire alignment was conducted using the wire alignment substrate 23 and the apparatus 1 explained above. Six magnetic wires 50 were pulled out from the wire bobbins 11 at the same time, and corresponding six base lines of the wire alignment substrate 23 were on the same plane. The interval between the two neighboring magnetic wires 50 pulled out together was 8.4 mm, which was 12 times the interval between the two neighboring grooves on the wire alignment substrate 23, which corresponded to the distance between the two neighboring MI elements.

The interval 8.4 mm of the simultaneously pulled out magnetic wires 50 assured that the wire chucks 21 for the six magnetic wires 50 did not interfere with each other when the magnetic wires 50 were pulled out. One alignment sequence in which six magnetic wires 50 were simultaneously aligned was repeated 12 times while the wire alignment substrate 23 was moved 700 µm, which was the interval between the two neighboring MI elements, between two alignment sequences using the horizontal feeding mechanism 321 of the substrate attaching base 24. This way, the magnetic wires 50 were aligned with all the 72 grooves, which were the base lines of the wire alignment substrate 23.

In the test, first, the magnetic wire 50 was pulled out with a proper tensile force to take a form of a straight line without slack to present the reference line for the alignment with the grooves 231 on the wire alignment substrate 23. The separation between the reference line and the base line was observed by the microscope 31. The holding parts 14 and 22 had already held the magnetic wire 50 in place to prevent misplacement even before the substrate attaching base 23 was elevated to the position for the alignment of the reference line and the base line.

The horizontal misplacement was measured with an accuracy of ±1 µm, and the rotational misplacement was measured with an accuracy of ±0.01 degrees. Then, the substrate attaching base 24 was moved horizontally and rotationally by the amounts of corresponding measured misplacements using the horizontal feeding mechanism 321 and the rotation mechanism 323 so as to correct the measured misplacements. After this adjustment, the substrate attaching base 24 was further elevated by the vertical feeding mechanism 322 so that the magnetic wires 50 touches the bottom of the grooves 231.

Then, the microscope 31 was again used to confirm that the magnetic wires 50 touched the bottom of the grooves 231 formed on the wire alignment substrate 23. The control parameters required to achieve this contact were stored in the control device so that they could be reused in the subsequent alignment sequences. It was confirmed that the magnetic power generation device 33 was able to operate as designed. That is, the magnetic wires 50 stayed at the bottom of the grooves 321 while remaining properly aligned, because of the magnetic power of the magnetic power generation device 33. It was also confirmed that all six magnetic wires 50 were aligned with corresponding six base lines at the same time and placed in corresponding six grooves 231 in an efficient manner because all six magnetic wires 50 were pulled out to be laid on the same plane with the interval 12 times the interval of the grooves 231.

After this first alignment sequence had been completed, the substrate attaching base 24 was moved 700 µm, which was the interval between the two neighboring MI elements, in the direction perpendicular to the elongation direction of the grooves 231. In total, twelve alignment sequences were performed to align all 72 base lines, i.e., the grooves 231, of the wire alignment substrate 23 with the magnetic wires 50.

In the first alignment sequence after the activation of the apparatus 1 for aligning magnetic wire, the position of the substrate attaching base 24 at the time when the reference line was aligned with the base line without misplacement was stored in the control device 40, as explained above. In the subsequent alignment sequences, the substrate attaching base 24 was moved into a position that is determined by adding to the stored initial position a corresponding number of the intervals (700 µm) of the MI elements. It was confirmed that the second through twelfth alignment sequences were successful without repeating the detection and correction of misplacement that was performed in the first alignment sequence.

The test results above confirmed that the apparatus 1 for aligning magnetic wire was capable of aligning magnetic wires 50 on the wire alignment substrate 23. However, in mass production in which the alignment sequence is repeated in an extremely large number, there could be instances when the magnetic wire 50 is misplaced from the groove 231 by a small amount because of the processing accuracy of the wire alignment substrate 23 and the manufacturing accuracy of the apparatus 1 itself, as explained above.

In view of the above, the apparatus 1 for aligning magnetic wire also included a swing mechanism. That is, the swing mechanism was provided to the feeding device 32 of the substrate attaching base 24 and was designed to generate vibration having amplitude of the width of the grooves 231 ±25 µm. In this test, the swing mechanism was activated for a series of alignment sequences, and it was confirmed that the rate of successful alignment was increased over the alignment sequences in which the swing mechanism was not activated. It is noted that the swing mechanism may not be required because the need for the swing mechanism can be eliminated by suitable measures, for example, high precision manufacturing of the wire alignment substrate 23.

In the test, the substrate attaching base 24 moved in parallel with the reference lines, which are the magnetic wire 50 taking a form of a straight line, so that the whole base lines of the wire alignment substrate 23 were placed at the same distance from corresponding reference lines, while the substrate attaching base 24 approached the magnetic wires 50. However, the apparatus 1 can move the wire alignment substrate 23 in a different manner. That is, the feeding device 32 also has a function of tilting the substrate attaching base 24, and the substrate attaching base 24 can move toward the magnetic wire 50 while being tilted with respect to the reference line such that the end of the substrate attaching base 24 on the wire supply device side is closer to the magnetic wire 50. When the leading end of the base line of the wire alignment substrate 23 touches the magnetic wire 50, the evaluation of the substrate attaching base 24 stops and the tilting angle is gradually reduced until the substrate attaching base 24 take the horizontal position.

In the test, the application of the tensile force to the magnetic wire 50 was temporarily stopped before the cutting of the magnetic wire 50, as explained above. That is, the tensile force applied to the magnetic wire 50 by the wire tensile force loading device 13 was set to zero after the magnetic wires 50 were aligned with the grooves 231, which are the base lines of the wire alignment substrate 23. Then, the magnetic wire 50 was cut by the cutter 25 while the movable blade 251 was sliding against the stationary blade 252. As a result, the portion of the magnetic wire 50, which had been cut away from the magnetic wire 50 aligned on the wire alignment substrate 23, was not pulled back toward the wire supply device side at the time of the cutting. After the cutting, the holding of the magnetic wire 50 by the intermediate holding part 22 and the wire chuck 21 was released. It was confirmed that the magnetic wires 50 remained in the grooves 231 maintaining the proper alignment while being held down to the bottom of the grooves 231 by the magnetic power of the magnetic power generation device 33.

During the cutting of the magnetic wire 50, no external forces were applied to the magnetic wire 50 other than the magnetic force generated by the magnetic power generation device 33 to hold the magnetic wire 50 down to the groove 231. Accordingly, the internal stresses induced in the magnetic wire 50 were equal along the longitudinal direction of the magnetic wire 50 during the cutting. This is because the magnetic wire 50 was held down to the wire alignment substrate 23 by magnetic power generated by the magnetic power generation device 33, which was equal along the longitudinal direction of the magnetic wire 50. It was confirmed that the magnetic wire 50 cut in the manner described above adhered to the wire alignment substrate 23 without generation of undesired stresses, such as torsional stresses.

In the test, the holding of the magnetic wires 50 was released after the cutting. However, the holding of the magnetic wires 50 may be released prior to the cutting as long as the magnetic wires 50 strongly adheres to the wire alignment substrate 23 by the magnetic power generated by the by magnetic power generation device 33 during the cutting. For this purpose, the apparatus 1 has a function of moving the downstream holding part 14B and the intermediate wire holding part 22 so that they stop holding of the magnetic wires 50. The upstream holding part 14A of the wire holding part 14 maintains the holding of the magnetic wire 50 during and after the cutting so as to prepare the remaining portion of the magnetic wire 50 for the griping by the wire chuck 21 for the next alignment sequence. In this arrangement as well, the tensile force applied by the wire tensile force loading device 13 is temporarily set to zero prior to the cutting.

As discussed above, the holding of the magnetic wire 50 by the wire holding part 14 does not rely on a wire chuck in this embodiment. However, if a wire chuck is used in the wire holding part 14, the temporary stopping of the application of the tensile force to the magnetic wire 50 by the wire tensile force loading device 13 may not be performed because the magnetic wire 50 is not pulled back toward the upstream side.

The microscope 31 of the misplacement detection device 30 has a resolution of about 1 μm. The microscope 31 was firmly attached to the main body of the apparatus 1 so as to be free from vibrations. An easily accessible handle was provided for the focus adjustment of the microscope 31. As explained above, the alignment using the misplacement detection device 30 is required only for the first alignment sequence of each wire alignment substrate 23. Further, image processing techniques may be used in lieu of visual inspection by an operator.

The substrate attaching base 24 was able to move 100 mm horizontally in the direction perpendicular to the base line of the wire alignment substrate 23 and move 20 mm vertically. The substrate attaching base 24 was controlled by the control device 40 that was capable of positioning with accuracy of ±1 μm throughout the range of the movement.

Figure 13:
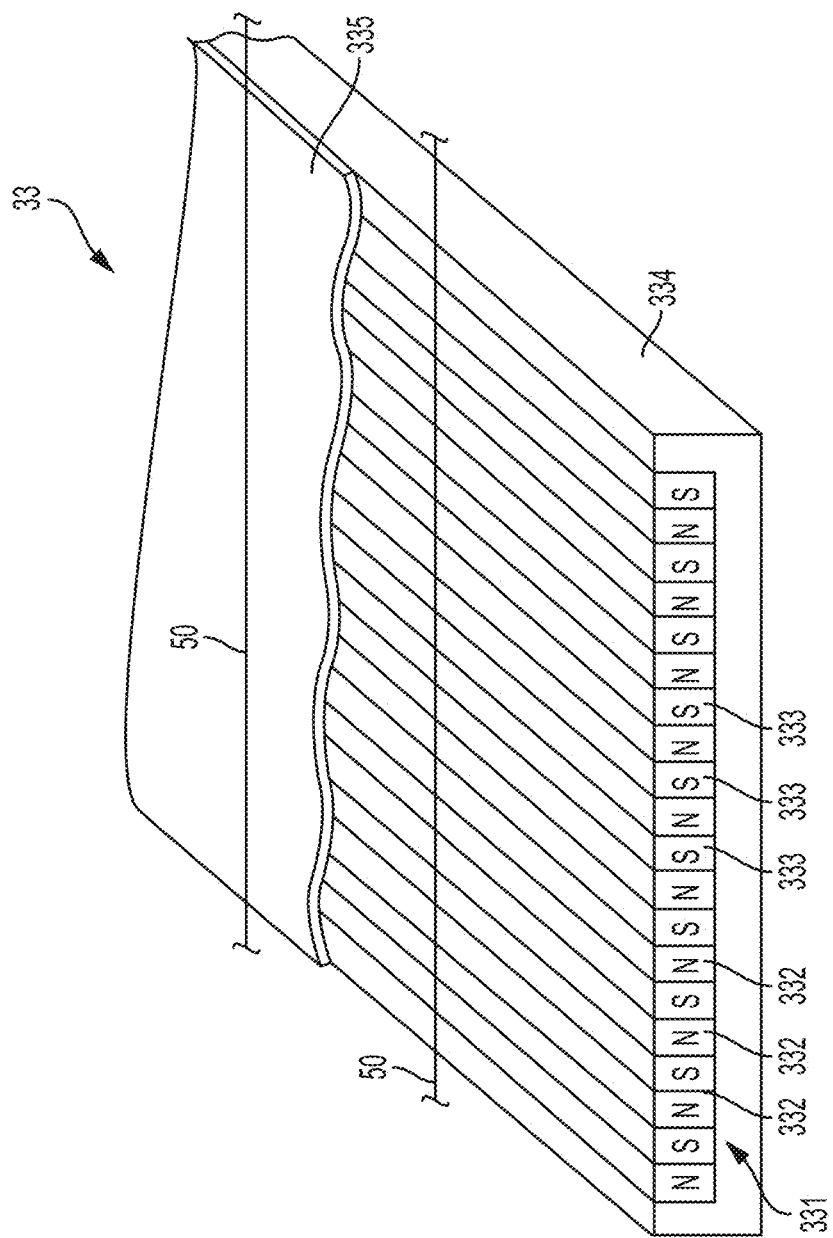
FIG. 13 is a conceptual perspective view showing the magnetic power generation device of the apparatus of FIG. 1.

FIG. 13 shows the magnetic power generation device 33. As shown in the drawing, the magnetic power generation device 33 includes an array of rectangular magnets 331, each having a length of 120 mm, a width of 5 mm and a thickness of 3 mm and being arranged to be perpendicular to the direction in which the magnetic wire 50 is pulled out. The magnets 331 were permanent magnets so that the magnetic power was maintained after the detachment of the magnetic power generation device 33 and the alignment substrate 23 from the substrate attachment base 24 regardless availability of power supply.

As shown in FIG. 13, the magnets 331 were arranged so that N poles 332 and the S poles 333 alternated and embedded in an iron yoke 334. The magnets 331 were covered by a nonmagnetic material 335, including alumina, having a depth of 0.2 mm. The magnets 331 were samarium-cobalt magnets because they can sustain strong magnetic power even under high temperature environments, such as the one the MI element is subject to during the permanent fixing of the magnetic wire 50 with resin under heating. The wire alignment substrate 23 was attached to the magnetic power generation device 33. It was confirmed that the magnetic wires 50 were temporarily held in the grooves 231 of the wire alignment substrate 23 by the magnetic power of the magnets 331 after the cutting. It was also confirmed that the cut magnetic wires 50 remained in the grooves 231 in a stable manner when the magnetic wires 50 were permanently fixed in the grooves 231 by resin in the next processing step of the MI elements.

The control device 40 included the following functions: automatic tensile force adjustment based on the input of wire properties, such as a diameter; temporary stopping and restarting of the application of tensile force; adjustment of the pressure of the wire chuck 21 and the cutting force for the wire cutting; adjustment of the origin of the substrate attaching base 24 and its return to the origin; the automatic return to the alignment position; adjustment of the position of the substrate attaching base 24 to correct the misplacement based on the misplacement detected by the microscope 31; controlling the operation of the apparatus 1 in the alignment sequence, including automatic elevation control of the substrate attaching base 24 based on the operation parameters, such as the depth of the wire alignment substrate 23, the depth of the grooves 231, and the diameter of the magnetic wire 50; and controlling the production conditions. The apparatus 1 had an ability to switch to a manual operation mode at an event of emergency.

With the arrangement pattern of MI elements 60 on the wire alignment substrate 23 shown in FIG. 19, it was confirmed that the magnetic wires 50 were aligned with the base lines of corresponding MI 60 after a series of alignment sequences was performed. As explained already above, one alignment sequence included: pulling out of the magnetic wire 50; elevation of the substrate attaching base 24 to the alignment position; temporary fixing of the magnetic wire 50 by magnetic power; temporary stopping of the application of the tensile force; cutting; retreat and return of the downstream holding part 14B of the wire holding part 14, the intermediate wire holding part 22 and the cutter 25; lowering and horizontal movement of the substrate attaching base 24; and reapplication of the tensile force.

As the test results show, the apparatus 1 for aligning magnetic wire was able to align the magnetic wires 50 with the base lines of the wire alignment substrate 23 at a small interval in an accurate manner and the speed suitable for mass production. The apparatus 1 has made remarkable progress in the field of mass manufacturing magnetic sensors, such as MI sensors, because the sensors require superfine magnetic wires 50, which were not handled properly before the invention of this apparatus 1.

Another embodiment of the invention is explained below. This embodiment is directed to the permanent fixing of the magnetic wire 50 after the temporary fixing of the magnetic wire 50 by magnetic power. As explained already above, the apparatus 1 of the embodiment explained above was able to align the cut magnetic wires 50 with the base lines of the wire alignment substrate 23 free from undesirable stresses, such as torsional stresses, and temporarily fix the cut magnetic wires 50 in the grooves 231 with the magnetic power of the magnetic power generation device 33. Again as explained above, the cut magnetic wires 50 must be fixed permanently to the wire alignment substrate 23 before they can be used in magnetic sensors. This embodiment relates to the permanent fixing of the magnetic wire 50.

The wire alignment substrate 23 after the wire alignment by the apparatus 1 of the embodiment included 72 magnetic wires 50 aligned with the interval of 700 µm, which was the distance between two neighboring MI elements on the wire alignment substrate 23. The wire alignment substrate 23 was transferred from the apparatus 1 to the subsequent process, while the magnetic power generation device 33 was attached to the wire alignment substrate 23 so that the magnetic wires 50 remained adhering to the wire alignment substrate 23.

In the subsequent process, the magnetic wires 50 temporarily fixed to the wire alignment substrate 23 were fixed permanently to the wire alignment substrate 23 by applying resin to the magnetic wires 50 and their surroundings. It is possible that the magnetic properties of MI elements may be deteriorated during the fixing of the MI elements with the resin if undesired stresses are induced during the fixing. However, it was confirmed that the magnetic properties, such as sensitivities, of the MI elements manufactured by the apparatus 1 and permanently fixed as described above did not deviate from the properties as designed and did not exhibit hysteresis problems.

One more embodiment of this invention is explained below. This embodiment is directed to aligning the magnetic wires 50 with an interval smaller than 700 µm. It is expected that the device specification of MI elements will be diversified in coming years and the apparatus 1 described above will need to perform various wire alignments according to the specification of the MI elements. For example, multiple magnetic wires 50 will be aligned parallel to each other in one MI element, and the interval of the magnetic wires 50 will become smaller as the MI element becomes smaller. In addition, one MI element will have multiple magnetic wires 50 connected in series or in parallel with one coil surrounding each magnetic wire 50.

In this embodiment, the apparatus 1 was modified to align a magnetic wire having a diameter of 10 µm with an interval of 50 to 300 µm. In particular, the grooves 231 of the wire alignment substrate 23 had a width of 20 µm and a depth of 20 µm. Further, the wire chuck 21, the width of the wire guide of the holding parts 14 and 22, and the depth of the groove of the blades of the cutter 25 were modified to adjust the smaller diameter of the magnetic wire 50. It was confirmed that the modified apparatus 1 was able to align the magnetic wire 50 of a diameter of 10 µm without any problems.

The apparatus 1 for aligning magnetic wires 50 described above enables manufacturing of various magnetic sensors, such as MI sensors, with simple and easy modification. Accordingly, the apparatus 1 for aligning magnetic wire described above contributes significantly to not only mass production of magnetic sensors but easy modification of the sensors.

The embodiments described above do not limit the scope of the invention. A person skilled in the art would be able to modify the embodiments within the scope of this invention.

What is claimed is:

1. A method of aligning a magnetic wire on a wire alignment substrate, comprising:
    providing apparatus that comprises: a wire supply device comprising a wire bobbin, a wire reel, a wire tensile force loading device, and a wire holding part that holds a magnetic wire; a wire alignment device comprising a wire chuck for pulling out the magnetic wire from the wire supply device, an intermediate wire holding part that holds the magnetic wire at an intermediate position between the wire holding part and the wire chuck, a wire alignment substrate on which the magnetic wire is aligned, a substrate attaching base to which the wire alignment substrate is attached, and a cutter that cuts the magnetic wire; a misplacement detection device that detects misplacement between a reference line that is determined by a longitudinal direction of the magnetic wire pulled out to be under a proper tension and a base line that indicates a predetermined position for aligning the magnetic wire on the wire alignment substrate, wherein the substrate attaching base comprises a position adjustment device that can move horizontally and vertically and can rotate so as to adjust a position of the substrate attaching base in order to align the base line of the magnetic wire pulled out to be under the proper tension with the base line of the wire alignment substrate, and a magnetic power generation device that generates magnetic power to have the magnetic wire adhere to the wire alignment substrate at the base line;
    configuring the apparatus to perform a continuous wire alignment feeding operation to control the wire supply device, the wire alignment device and the misplacement detection device so that the pulling out of the magnetic wire by the wire chuck, the alignment of the magnetic wire on the wire alignment substrate, and the cutting of the aligned magnetic wire are performed in succession;
    moving the base line of the wire alignment substrate to the reference line determined by the longitudinal direction of the magnetic wire pulled out using the position adjustment device;
    holding the magnetic wire which is pulled out to be under the proper tension, to avoid misplacement from the base line of the wire alignment substrate, using the wire chuck, the wire holding portion and the intermediate wire holding portion;
    having the magnetic wire adhere to the wire alignment substrate using the magnetic power generated by the magnetic power generation device of the substrate attaching base during the holding of the magnetic wire;
    cutting the magnetic wire while internal stresses induced in the magnetic wire are equal in the magnetic wire during the holding and the adhering of the magnetic wire; the cutting of the magnetic wire being performed at a position between the wire holding portion and the intermediate wire holding portion;
    temporarily fixing, using the magnetic power generated by the magnetic power generation device, the magnetic wire to the wire alignment substrate along the base line free from torsional stresses by releasing the holding of the magnetic wire by the wire chuck, the wire holding part and the intermediate wire holding part.

2. The method of claim 1, further comprising fixing the magnetic wire to the wire alignment substrate without the torsional stresses, by applying resin to the wire alignment substrate and curing the resin on the wire alignment substrate.

3. The method of claim 1, wherein the intermediate wire holding part comprises, as a wire guide, a groove which the magnetic wire passes through, so that the magnetic wire is held without misplacement at a position between an edge of the wire alignment substrate on the side of the wire supply device and a position in which the magnetic wire is cut by the cutter.

4. The method of claim 1, wherein the wire holding part comprises, as a wire guide, a groove which the magnetic wire passes through, so that the magnetic wire is held without misplacement at a position between an edge of the wire holding part on the side of the wire bobbin and a position in which the magnetic wire is cut by the cutter.

\* \* \* \* \*